US008119429B2

(12) United States Patent
Tamura et al.

(10) Patent No.: US 8,119,429 B2
(45) Date of Patent: Feb. 21, 2012

(54) METHOD FOR FABRICATING NITRIDE SEMICONDUCTOR LASER DEVICE AND NITRIDE SEMICONDUCTOR LASER DEVICE

(75) Inventors: Satoshi Tamura, Osaka (JP); Hiroshi Ohno, Osaka (JP); Norio Ikedo, Osaka (JP); Masao Kawaguchi, Osaka (JP)

(73) Assignee: Pansonic Corporation, Osaka (JP)

( * ) Notice: Subject to any disclaimer, the term of this patent is extended or adjusted under 35 U.S.C. 154(b) by 246 days.

(21) Appl. No.: 11/953,459

(22) Filed: Dec. 10, 2007

(65) Prior Publication Data

US 2008/0144684 A1 Jun. 19, 2008

(30) Foreign Application Priority Data

Dec. 13, 2006 (JP) ................................ 2006-335528

(51) Int. Cl.
*H01L 21/302* (2006.01)
*H01L 21/461* (2006.01)

(52) U.S. Cl. ............ 438/47; 257/E33.025; 257/E33.024

(58) Field of Classification Search ..................... 438/47
See application file for complete search history.

(56) References Cited

U.S. PATENT DOCUMENTS 5,933,443 A * 8/1999 Mushiage et al. ....... 372/46.014
6,111,275 A * 8/2000 Hata .............................. 257/97
7,244,968 B2 * 7/2007 Yoo .............................. 257/101
2005/0159000 A1 7/2005 Ohno et al.
2005/0279993 A1 12/2005 Tamura et al.
2006/0197104 A1 * 9/2006 Tamura et al. ................ 257/103

FOREIGN PATENT DOCUMENTS

JP 10-027947 1/1998
JP 10-093140 4/1998
JP 10-093199 4/1998
JP 10-335701 12/1998
JP 2003-142780 5/2003
JP 2003-249481 9/2003
JP 2006-128661 5/2006

OTHER PUBLICATIONS

Youtsey et al. "Smooth n-type GaN surfaces by photoenhanced wet etching", Applied Physics Letters, vol. 72, No. 5, Feb. 1998 pp. 560-562.

* cited by examiner

*Primary Examiner* — Bradley K Smith
*Assistant Examiner* — Mohammad Choudhry
(74) *Attorney, Agent, or Firm* — McDermott Will & Emery LLP

(57) ABSTRACT

A p-type GaN guiding layer, an n-type GaN layer, and an n-type AlGaN current blocking layer are sequentially formed over an active layer, and then part of the current blocking layer is etched by using an alkali solution and irradiating the part with light to form an opening. Thereafter, a second p-type GaN guiding layer is formed on the current blocking layer to cover the opening. In this structure, the GaN layer has a smaller energy gap than the AlGaN current blocking layer.

13 Claims, 9 Drawing Sheets

FIG. 3
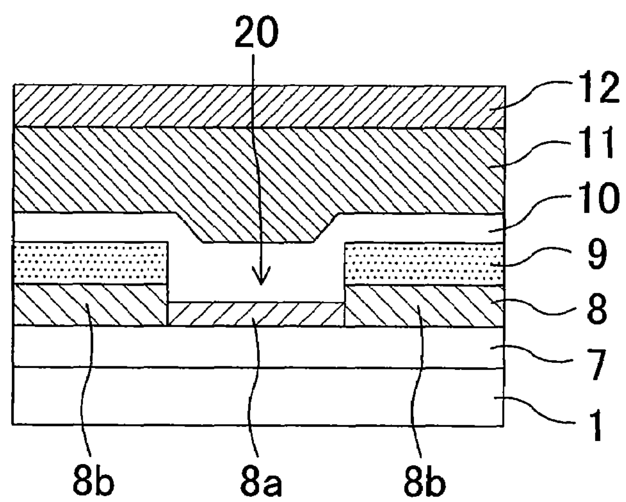
FIG. 4A
FIG. 4B
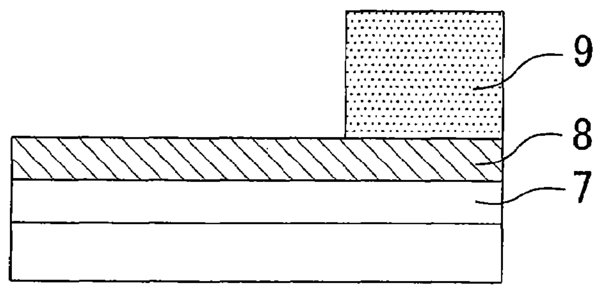

METHOD FOR FABRICATING NITRIDE SEMICONDUCTOR LASER DEVICE AND NITRIDE SEMICONDUCTOR LASER DEVICE

CLAIM OF PRIORITY

This application claims the benefit of Japanese Patent Application No. JP 2006-335528, filed on Dec. 13, 2006 the disclosure of which is incorporated herein by reference.

BACKGROUND OF THE INVENTION (a) Fields of the Invention

The present invention relates to nitride semiconductor laser devices and fabrication methods of the same, and in particular to a nitride semiconductor laser device having a buried current blocking layer and a fabrication method of the same.

(b) Description of Related Art

Currently, a group III-V nitride-based compound semiconductor including group III elements of aluminum (Al), gallium (Ga) and indium (In) and a group V element of nitrogen (N), typified by gallium nitride (GaN) and represented by a general formula, $In_XGa_YAl_{1-X-Y}N$ (wherein $0 \leqq X \leqq 1$, $0 \leqq Y \leqq 1$ and $X+Y \leqq 1$), i.e., what is called a nitride semiconductor (hereinafter referred to as a GaN-based semiconductor), is regarded remarkable. With respect to, for example, an optical device, a light emitting diode (LED) using a nitride semiconductor is used in a large display device, a traffic light and the like. Also, a white LED obtained by combining an LED using a nitride semiconductor and a fluorescent material is partially commercialized and is expected to be substituted for currently used lighting equipment when the luminous efficiency is improved in the future.

Furthermore, a violet semiconductor laser device using a nitride semiconductor is now being earnestly studied and developed. As compared with a conventional semiconductor laser device emitting red or infrared light used for an optical disk such as a CD or a DVD, a spot diameter obtained on the optical disk can be reduced in using the violet laser device, and hence, the recording density of the optical disk can be improved.

The gallium nitride-based materials have excellent physical properties, such as a high breakdown electric field, a high electron saturation velocity in a high electric field, and a high two-dimensional electron gas density in a heterojunction, and therefore, are considered as highly potential materials for electronic devices.

In order to fabricate the above-mentioned device using nitride semiconductor, it is necessary to etch the nitride semiconductor into an arbitrary shape. In general, dry etching is employed for nitride semiconductor.

FIG. 7 is a sectional view showing a general structure of a blue-violet semiconductor laser device (referred hereinafter to as "a blue-violet LD") using a GaN-based material (see Patent Document 1 (Japanese Unexamined Patent Publication No. 2003-142780)).

Referring to FIG. 7, the blue-violet LD includes a GaN substrate 101, an n-GaN layer 102, an n-AlGaN cladding layer 103, an n-GaN guiding layer 104, an MQW active layer 105 made of InGaN, a p-AlGaN overflow-suppressing layer 106, a p-GaN guiding layer 107, an n-AlGaN current blocking layer 109, a second p-GaN guiding layer 110, a p-AlGaN cladding layer 111, and a p-GaN contact layer 112.

The thus structured blue-violet LD is called a buried-type device. In this device, current does not flow through the n-AlGaN current blocking layer 109, but only flows through an opening from which the n-AlGaN current blocking layer 109 is removed. Light is confined by the refractive index difference between the n-AlGaN current blocking layer 109 and the second p-GaN guiding layer 110.

FIGS. 8A to 8C are sectional views showing process steps of a typical method for fabricating a buried blue-violet LD. Referring to FIG. 8A, the n-GaN layer 102, the n-AlGaN cladding layer 103, the n-GaN guiding layer 104, the MQW active layer 105 of InGaN, the p-AlGaN overflow-suppressing layer 106, the p-GaN guiding layer 107, and the n-AlGaN current blocking layer 109 are sequentially formed first on the GaN substrate 101 by a first growth by a MOCVD method.

Next, as shown in FIG. 8B, in order to form a current injecting area, part of the n-AlGaN current blocking layer 109 is etched to form an opening 120.

Thereafter, as shown in FIG. 8C, the second p-GaN guiding layer 110, the p-AlGaN cladding layer 111, and the p-GaN contact layer 112 are sequentially formed on the n-AlGaN current blocking layer 109 by a second growth by a MOCVD method to cover the opening 120, thereby fabricating a blue-violet LD.

In the above fabrication method, dry etching generally using a chlorine-based gas as an etching gas is employed for removing the part of the n-AlGaN current blocking layer 109. This dry etching, however, may damage the etched surface to cause degrade to the characteristics of the blue-violet LD. In particular, in the buried type structure, dry etching is performed on the portion that guides laser light, which disadvantageously leads to significant degradation of the threshold current for laser oscillation and the like.

One of etching methods causing less damage than the dry etching is a wet etching. However, nitride semiconductors are less etched with acids or alkalis in general.

Among them, a photoelectrochemical (PEC) etching is known as a method for wet etching the nitride semiconductor (see Patent Document 2 (Japanese Unexamined Patent Publication No. H10-93140) and Non-Patent Document 1 (Appl. Phys. Lett, vol. 72, No. 5, 2 Feb. 1998, p.p. 560-562)). FIG. 9 is a schematic view showing the PEC etching method. A nitride semiconductor layer 115 of GaN or the like connected to a platinum (Pt) cathode 114 is immersed in a potassium hydroxide (KOH) solution 113, and the layer 115 is irradiated with ultraviolet light from the outside to thus etch the nitride semiconductor layer 115.

The PEC etching etches n-type nitride semiconductor but does not etch p-type nitride semiconductor. Hereinafter, the mechanism of the PEC etching will be described with reference to FIGS. 10 and 11.

When an n-type nitride semiconductor is immersed in a KOH solution, it exhibits the band structure as shown in FIG. 10. In order to etch the nitride semiconductor by allowing GaN to react with holes and $OH^-$ as expressed by the following relation, the holes must be present at the interface between the nitride semiconductor and the KOH solution.

$$GaN+3h^++6OH^- \rightarrow 2GaO_3^{3-}+0.25N_2+3H_2O$$

As shown in FIG. 10, it is possible to accumulate holes at the interface with the band structure shown in this figure. However, there are fewer holes in the n-type nitride semiconductor. In view of this, the n-type nitride semiconductor is irradiated with light having a higher energy than the band gap of the n-type nitride semiconductor to generate holes at the interface, thereby promoting etching of the n-type nitride semiconductor.

When a p-type nitride semiconductor is immersed in the KOH solution, it exhibits the band structure as shown in FIG. 11. There are many holes in the p-type nitride semiconductor.

However, since it has the band structure resistant to accumulating holes at the interface, no etching is observed even though it is irradiated with the light.

SUMMARY OF THE INVENTION

The inventors of the present invention studied the method for fabricating an buried blue-violet LD by applying the above-described PEC etching for formation of an opening of a current blocking layer. We found that the fabricated blue-violet LD always had a higher operating voltage than the expected value.

Then, the cross section of the current blocking layer 109 of the blue-violet LD formed using the PEC etching was observed by a transmission electron microscope (TEM). FIG. 12A is a photograph of a cross-sectional TEM image around the opening of the current blocking layer 109, and FIG. 12B is a schematic view showing the contours of the image for easy understanding. As shown in FIGS. 12A and B, it is found that the current blocking layer 109 is removed incompletely by the etching, and a current blocking layer 109*a* with a thickness of about several nanometers to several tens of nanometers remains on the p-type GaN guiding layer 107 in the opening 120 of the n-type AlGaN current blocking layer 109.

In addition, FIG. 13 shows the relationship between the operating voltage and the thickness of the current blocking layer 109*a* remaining below the opening 120. There is a strong correlation between the operating voltage (vertical axis) and the thickness of the remaining current blocking layer (horizontal axis). As the current blocking layer 109*a* remaining below the opening 120 is thicker, the operating voltage of the blue-violet LD is higher.

To confirm the foregoing, a further study was conducted on how the current blocking layer 109*a* remaining below the opening 120 influences the operating voltage of the blue-violet LD.

FIG. 14 is a sectional view showing the structure of the blue-violet LD, which is obtained in such a manner that the second p-GaN guiding layer 110 and the like are deposited on the current blocking layer 109*b* by the second growth to fill the opening with a portion 109*a* of the current blocking layer remaining below the opening of the n-AlGaN current blocking layer 109.

In this structure, in the second growth, a p-type impurity (for example, Mg) may be diffused into the n-type current blocking layer 109*a* remaining below the opening from the second p-GaN guiding layer 110 located thereabove and/or the p-GaN guiding layer 107 located therebelow, which may change the conductivity of the n-type current blocking layer 109*a* to p-type. In this case, the current blocking layer 109*a* remaining below the opening incompletely blocks the current, and thus, the current flows sequentially through the p-AlGaN cladding layer 111, the second p-GaN guiding layer 110, the p-AlGaN current blocking layer 109*a*, the p-GaN guiding layer 107, and the p-AlGaN overflow-suppressing layer 106.

However, the p-AlGaN current blocking layer 109*a* has a high Al content (generally, about 10 to 20%) and a large energy gap Eg. Therefore, when the current flows through the p-AlGaN current blocking layer 109*a*, it acts as a potential barrier layer. This affects the operating voltage.

The present invention has been made in view of the problems described above, and its object is to provide an buried-type nitride semiconductor laser device having stable characteristics, and a fabrication method thereof.

To solve the above problems, the inventors of the present invention studied why the current blocking layer 109*a* having a thickness of about several nanometers to several tens of nanometers inevitably remains by incomplete removal of the n-AlGaN current blocking layer 109 by the PEC etching.

As described above, the PEC etching greatly affects the band structure around the interface between the nitride semiconductor layer and the KOH solution. As shown in FIGS. 12A and 12B, almost of all part of the n-AlGaN current blocking layer 109 is etched, but the n-AlGaN current blocking layer 109*a* close to the p-GaN guiding layer 107 is remained. From this, it is thought that some factors which greatly vary the band structure of the n-AlGaN current blocking layer 109 the p-GaN guiding layer 107 cause the etch residue.

That is to say, the conceivable phenomenon is as follows. As shown in FIG. 15, a depletion layer is formed at the interface between the n-AlGaN current blocking layer 109 and the p-GaN guiding layer 107. When the etching reaches a region of the depletion layer, holes having been generated by light irradiation in the n-AlGaN current blocking layer 109 diffuse from the interface with KOH to the p-GaN guiding layer 107. As a result, the etching does not reach the interface $P_2$ between the n-AlGaN current blocking layer 109 and the p-GaN guiding layer 107 and stops at the interface $P_1$, that is at the edge of the depletion layer. Actually, a remaining film with thickness of several nanometers to several tens of nanometers was observed. This thickness is in close agreement with the width of the depletion layer calculated from the layer structure.

From the above reason, it is basically impossible to completely remove the n-type nitride semiconductor layer in contact with the p-type nitride semiconductor layer.

Based on the discussion described above, an buried-type nitride semiconductor laser device finally provided by the inventors of the present invention is characterized in that, as shown in a sectional view of FIG. 1A, an n-type nitride semiconductor layer 8 having a smaller energy gap than that of the current blocking layer 9 is additionally provided between a p-type guiding layer 7 and an n-type current blocking layer 9.

FIG. 1B is a diagram showing the band structure taken along the line Ib-Ib in FIG. 1A. In this device, a depletion layer is generated between the n-type nitride semiconductor layer 8 and the p-type guiding layer 7. When the n-type current blocking layer 9 is removed by PEC etching, the etching further proceeds to reach the boundary $P_1$ between the n-type current blocking layer 9 and the n-type nitride semiconductor layer 8 because no depletion layer is formed in the n-type current blocking layer 9. Then, the etching stops at the edge $P_2$ of the depletion layer in the n-type nitride semiconductor layer 8. That is to say, as shown in FIG. 1A, the n-type current blocking layer 9 is completely removed while part of the n-type nitride semiconductor layer 8 remains on the p-type guiding layer 7 instead.

In this state, in the case where the n-type nitride semiconductor layer 8 has a smaller energy gap than the nitride semiconductor layer constituting the current blocking layer 9, even when the current flows nitride semiconductor layer 8 changing its conductivity to p-type, the nitride semiconductor layer 8 does not act as a potential barrier layer. As a result, the low operating voltage of the nitride semiconductor laser device can be obtained.

A method for fabricating a nitride semiconductor laser device according to the present invention is a method for fabricating a nitride semiconductor laser device including a current blocking layer with an opening for narrowing a current flowing into an active layer, which includes: the step (a) of sequentially forming, on the active layer, a p-type first nitride semiconductor layer, an n-type second nitride semiconductor layer, and an n-type third nitride semiconductor layer constituting the current blocking layer; the step (b) of etching part of the third nitride semiconductor layer by using an alkali solution and irradiating the part with light to form the opening of the current blocking layer; and the step (c) of forming a p-type fourth nitride semiconductor layer on the third nitride semiconductor layer to cover the opening of the current blocking layer, and the second nitride semiconductor layer has a smaller energy gap than the third nitride semiconductor layer.

Preferably, in the step (c), the conductivity of a region of the second nitride semiconductor layer located below the opening is changed to a p-type conductivity by diffusing a p-type impurity from the first nitride semiconductor layer and the fourth nitride semiconductor layer.

Preferably, the second nitride semiconductor layer has a thickness greater than the width of a portion of a depletion layer formed in the second nitride semiconductor layer, the depletion layer being formed between the first nitride semiconductor layer and the second nitride semiconductor layer With the method for fabricating a nitride semiconductor laser device according to the present invention, even though a PEC etching is performed to form the opening of the current blocking layer, part of the current blocking layer never remains below the opening. Therefore, an buried nitride semiconductor laser device with stable characteristics can be provided.

BRIEF DESCRIPTION OF THE DRAWINGS

FIG. 3 is a sectional view of a current blocking structure of this embodiment.

FIG. 4A is a photograph of a cross-sectional TEM image after etching of a current blocking layer according to this embodiment, and FIG. 4B is a schematic view showing the contours of the image for the sake of easy understanding.

Figure 1A:
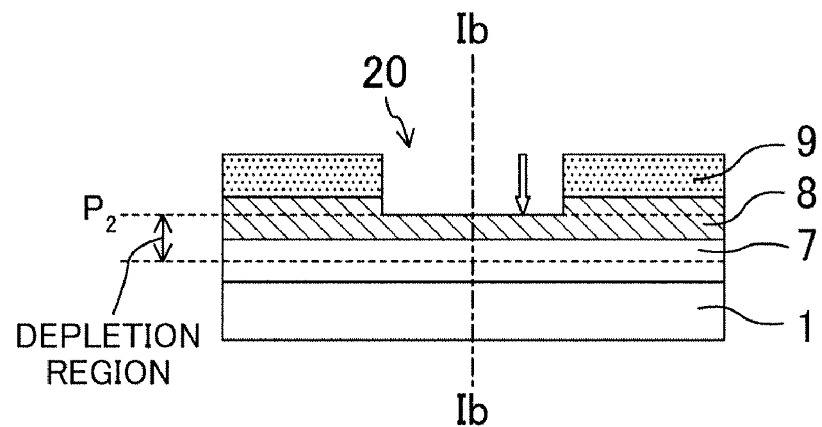
FIG. 1A is a sectional view showing a current blocking structure of a nitride semiconductor laser device according to the present invention.

DETAILED DESCRIPTION OF THE PREFERRED EMBODIMENTS (Embodiment)

Embodiments of the present invention will be described below with reference to the accompanying drawings. In the drawings referred to in the following description, the components having substantially identical functions are denoted by the same reference numerals for the sake of simplicity. The present invention is not limited to the following embodiments.

FIGS. 2A to 2D are sectional views schematically showing process steps of a method for fabricating a nitride semiconductor laser device according to an embodiment of the present invention.

Figure 2A:
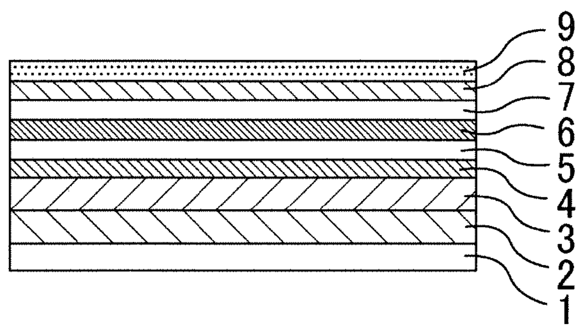
FIGS. 2A to 2D are sectional views showing process steps of a method for fabricating a nitride semiconductor laser device according to an embodiment of the present invention.

Referring to FIG. 2A, first, an n-GaN layer 2, an n-AlGaN cladding layer 3, an n-GaN guiding layer 4, an MQW active layer 5 made of InGaN, a p-AlGaN overflow-suppressing layer 6, a p-GaN guiding layer (a first nitride semiconductor layer) 7, an n-GaN layer (a second nitride semiconductor layer) 8, and an n-AlGaN current blocking layer (a third nitride semiconductor layer) 9 are sequentially formed on a GaN substrate 1 by a first growth by a MOCVD method. In this structure, the n-GaN layer 8 is doped with, for example, Si as an n-type impurity.

Figure 2B:
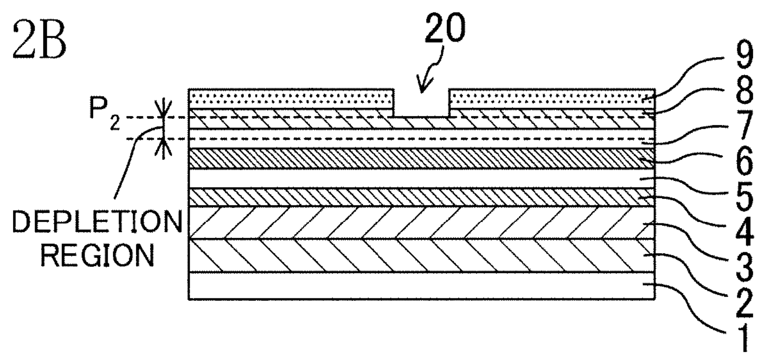

Next, as shown in FIG. 2B, a portion of the n-AlGaN current blocking layer 9 is removed by a PEC etching to form an opening 20. The PEC etching is performed by using, for example, an alkaline solution and irradiating the layer with light having a higher energy than the band gap of the nitride semiconductor.

Figure 2C:
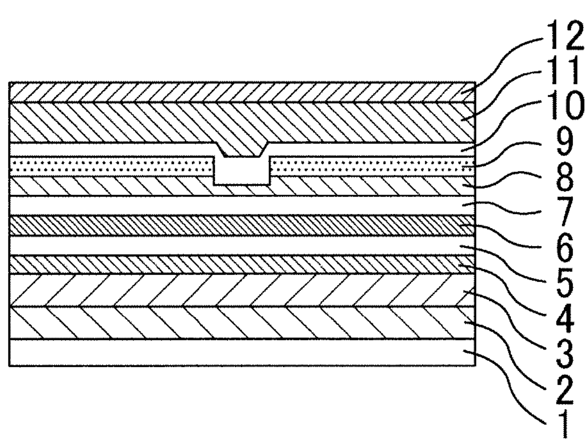

Subsequently, as shown in FIG. 2C, a second p-GaN guiding layer (a fourth nitride semiconductor layer) 10, a p-AlGaN cladding layer 11, a p-GaN contact layer 12 are sequentially formed on the n-AlGaN current blocking layer 9 by a second growth by a MOCVD method to cover the opening 20.

Figure 2D:
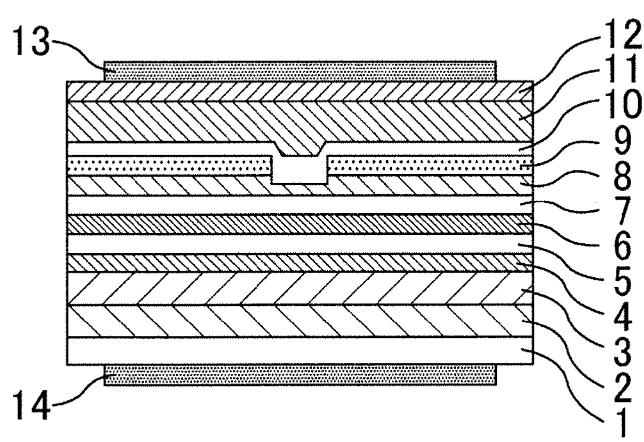

Finally, as shown in FIG. 2D, a p-type electrode 13 is formed on the p-GaN contact layer 12, and an n-type electrode 14 is formed on the back surface of the GaN substrate 1. In the manner described above, the buried-type nitride semiconductor laser device is completed.

FIG. 3 is an enlarged sectional view showing the vicinity of the opening of the current blocking layer of the nitride semiconductor laser device fabricated by the above method. A portion 8*a* of the GaN layer (a GaN layer portion 8*a*) remaining below the opening 20 of the n-AlGaN current blocking layer 9 is changed in its conductivity to p-type by diffusion of a p-type impurity from the p-GaN guiding layer 7 and the second p-GaN guiding layer 10 in second growth of the second p-GaN guiding layer 10 and the like in a MOCVD method. Even when a p-type impurity is also diffused into a portion 8*b* of the GaN layer (a GaN layer portion 8*b*) below the n-AlGaN current blocking layer 9, the conductivity of the portion is not changed to p-type. Thus, this portion functions as a current blocking layer in conjunction with the n-AlGaN current blocking layer 9.

Figure 1B:
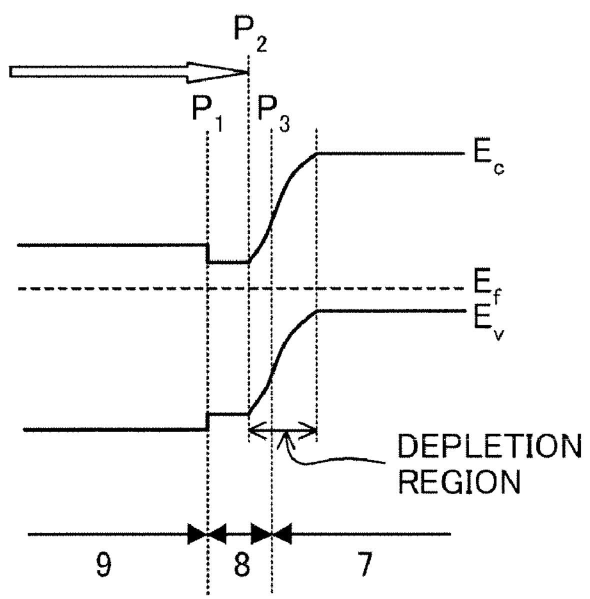
FIG. 1B is a diagram showing the band structure taken along the line Ib-Ib in FIG. 1A.

In this structure, preferably, as shown in FIG. 1B, the thickness of the n-GaN layer 8 is greater than the width of a depletion layer in the n-GaN layer 8, which is part of a depletion layer formed between the n-GaN layer 8 and the p-GaN guiding layer 7. It is possible to etch layers from the surface to the edge $P_2$ of the depletion layer in the n-GaN layer 8 by PEC etching, so that the n-AlGaN current blocking layer 9 can be removed completely. In this case, as shown in FIG. 1A, the n-GaN layer 8 below the opening 20 is etched in the thickness direction to become thin.

The width of the depletion layer varies according to the impurity concentrations in the p-GaN guiding layer 7 and the n-GaN layer 8. Preferably, the thickness of the n-GaN layer 8 is 5 nm or more. However, if the thickness of the n-GaN layer 8 is too great, change of the conductivity of the n-GaN layer 8 to p-type by diffusion of a p-type impurity in the second growth becomes difficult. From this, the thickness of the n-GaN layer 8 is desirably 50 nm or smaller.

In the case where the n-GaN layer 8 has a smaller thickness than the width of the depletion layer formed in the n-GaN layer 8, the depletion layer is formed to expand even in the n-AlGaN current blocking layer 9. Therefore, the n-AlGaN current blocking layer 9 cannot be completely removed. However, the thickness of the remaining n-AlGaN current blocking layer 9 can be thinned significantly, so that low operating voltage can be obtained.

FIG. 4A is a photograph of a cross-sectional TEM image of the sample ,with the n-AlGaN current blocking layer 9 and the n-GaN layer 8 on a sample p-GaN guiding layer 7, after PEC etching, and FIG. 4B is a schematic view showing the contours of the image for easy understanding. As shown in FIGS. 4A and 4B, it is found that the n-AlGaN current blocking layer 9 is etched completely by forming the n-GaN layer 8 below the n-AlGaN current blocking layer 9.

In this embodiment, as shown in FIG. 3, during the second growth, Mg as a p-type impurity is introduced by thermal diffusion into the GaN layer portion 8*a* remaining in the opening 20 of the n-AlGaN current blocking layer 9, thereby changing the conductivity of this portion to p-type. However, depending on the deposition temperature of the second MOCVD and the Mg concentration in the p-GaN guiding layer 7 and/or the second p-GaN guiding layer 10, only an insufficient amount of Mg may diffuse. As a result of this, the GaN layer portion 8*a* may be changed to p-type layer with a relatively high resistance.

In this case, the layer 8 formed between the p-GaN guiding layer 7 and the n-AlGaN current blocking layer 9 may be substituted, instead of the GaN layer, with an InGaN layer having a smaller energy gap than the AlGaN current blocking layer 9. Since diffusion coefficient of Mg in InGaN layer is smaller than GaN, the InGaN layer portion 8*a* can contain a great amount of Mg during the second growth to further reduce the resistance of the p-type layer. In order to exert the effect of containing Mg, the In content therein is desirably 2% or higher. Depending on the light emission wavelength, the light may be absorbed in the InGaN layer 8 to degrade the device characteristics. In this case, the InGaN layer may be substituted with a GaAlInN layer having a slightly larger band gap.

As another approach, the step of introducing a p-type impurity (for example, Mg) into the GaN layer portion 8*a* below the opening 20 may be additionally carried out after the step of forming the opening 20 in the n-AlGaN current blocking layer 9 and before the step of forming the second p-GaN guiding layer 10. An approach in which an electric field is applied to diffuse Mg can also be employed.

(First Modification of Embodiment)

In the present invention, by setting the thickness of the n-GaN layer 8 to be greater than the width of the depletion layer in the n-GaN layer 8 which is part of the depletion layer formed between the n-GaN layer 8 and the p-GaN guiding layer 7, as shown in FIG. 1B, the PEC etching can reach the edge $P_2$ of the depletion layer in the n-GaN layer 8 to thus remove the n-AlGaN current blocking layer 9 completely.

However, even though the thickness of the n-GaN layer 8 is greater than the width of the depletion layer, a portion of the n-AlGaN current blocking layer 9 with the thickness of several nanometers may remain after the PEC etching. The cause of this phenomenon is uncertain, but the following factor might be involved.

To be more specific, in general, nitride semiconductors differing in composition have greatly different lattice constants. Therefore, junction of the layers with different compositions with each other generates a piezoelectric field. Accordingly, the piezoelectric filed generated by the stain is applied to the nitride semiconductor layers. Since the n-GaN layer 8 and the n-AlGaN current blocking layer 9 have greatly different composition, the band structure is thought to be changed by a piezoelectric field. Then, a portion of the n-AlGaN current blocking layer 9 remains even after the PEC etching because of changing the band structure.

Figure 5:
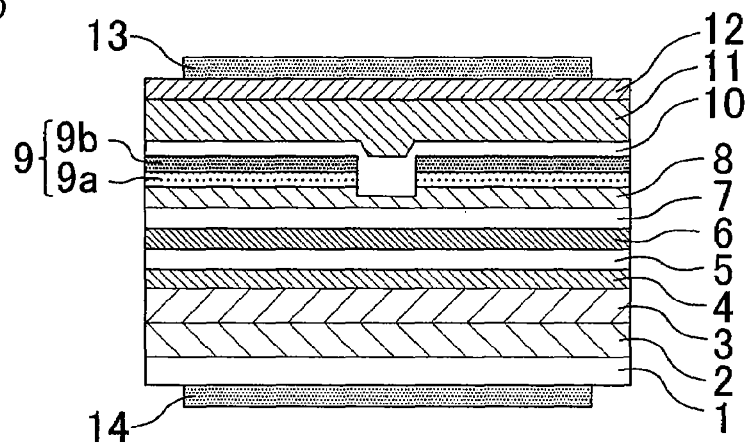
FIG. 5 is a sectional view showing the structure of a nitride semiconductor laser device according to a first modification of this embodiment.

To deal with such a problem, by reducing the strain generated in a portion of the current blocking layer 9 located around the n-GaN layer 8, the piezoelectric field can be reduced to suppress a change of the band structure. Specifically, as shown in FIG. 5, the n-AlGaN current blocking layer 9 is composed a layer located closer to the interface with the n-GaN layer 8 as an n-AlGaN current blocking layer 9*a* and a layer located apart from the interface as an n-AlGaN current blocking layer 9*b*, wherein the Al composition in the n-AlGaN current blocking layer 9*a* is set smaller than the Al composition in the n-AlGaN current blocking layer 9*b*. With this structure, a piezoelectric field applied to the n-GaN layer 8 and the n-AlGaN current blocking layer 9*a* is reduced to suppress a change of the band structure. This enables a complete removal of the n-AlGaN current blocking layer 9 by the PEC etching. Thus, the operating voltage of the blue-violet LD can be further reduced.

The Al composition in the n-AlGaN current blocking layer 9 is not limited to the two-step profile, and it may be formed in an arbitrary-step profile. The profile of the Al composition is not limited to a step profile, and it may be formed in continuously variable slope.

As another approach to reducing strain between the n-GaN layer 8 and the n-AlGaN current blocking layer 9, the current blocking layer 9 may be made of $Ga_yAl_zIn_{1-y-z}N$ (wherein y>0 and z>0). By using a layer of quaternary compound as the current blocking layer 9, the layer can be formed to have a closer lattice constant to the n-GaN layer 8 without changing the light-distribution characteristic. That is to say, strain between he current blocking layer 9 and the n-GaN layer 8 can be decreased to reduce or eliminate the etch residue of the current blocking layer.

However, in general, during growth with MOCVD, the $Ga_yAl_zIn_{1-y-z}N$ layer is formed at a lower growth temperature than the growth temperature of a layer containing no In. Therefore, it is difficult to form $Ga_yAl_zIn_{1-y-z}N$ with a good crystallinity. To deal with this difficulty, it is desirable that only a portion of the current blocking layer 9 around the interface with the n-GaN layer 8 is made of a quaternary compound layer and the other portion thereof is made of an AlGaN layer.

(Second Modification of Embodiment)

Another conceivable reason why a portion of the n-AlGaN current blocking layer 9 is not etched and still remains is that not only the piezo effect described above but also the following factor is involved therein.

To be more specific, in the case where the n-AlGaN current blocking layer 9 and the n-GaN layer 8 have Fermi levels different from each other, the band structure around the interface therebetween will probably change when the n-AlGaN current blocking layer 9 and the n-GaN layer 8 are brought into junction with each other.

Figure 6A:
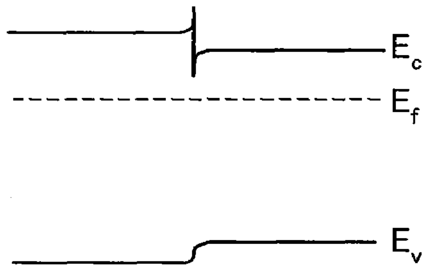
FIGS. 6A to 6C are diagrams showing band structures of a nitride semiconductor laser device according to a second modification of this embodiment.
Figure 6B:
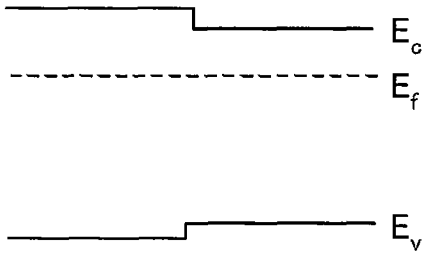
Figure 6C:
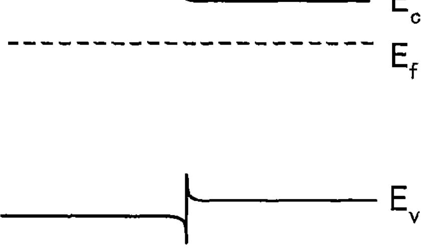
Figure 7:
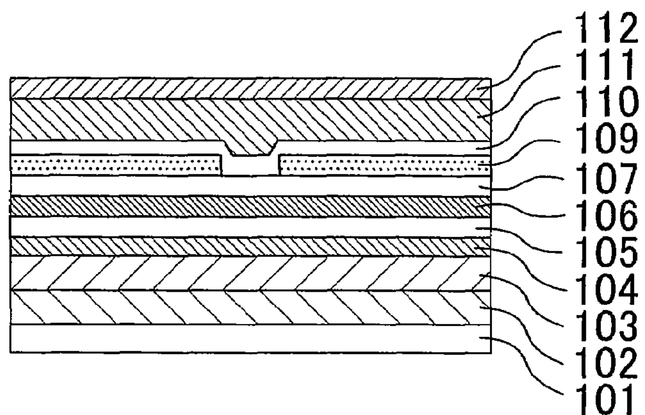
FIG. 7 is a sectional view showing the structure of a conventional nitride semiconductor laser device.
Figure 8A:
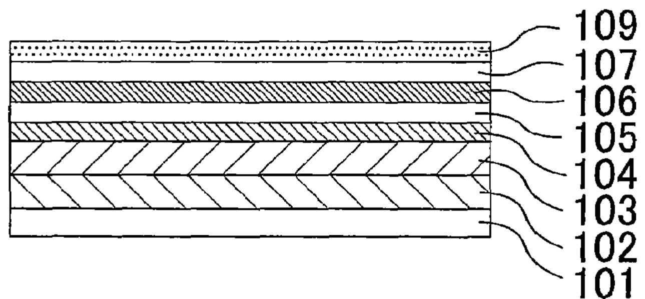
FIGS. 8A to 8C are sectional views showing process steps of a conventional method for fabricating a nitride semiconductor laser device.
Figure 8B:
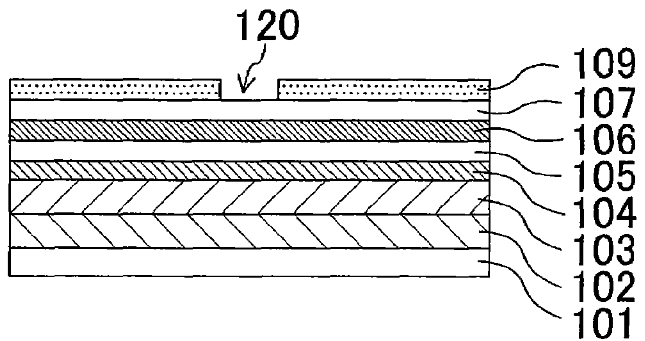
Figure 8C:
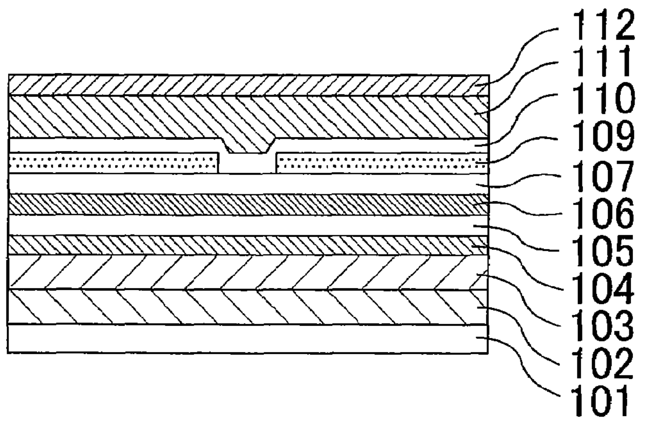
Figure 9:
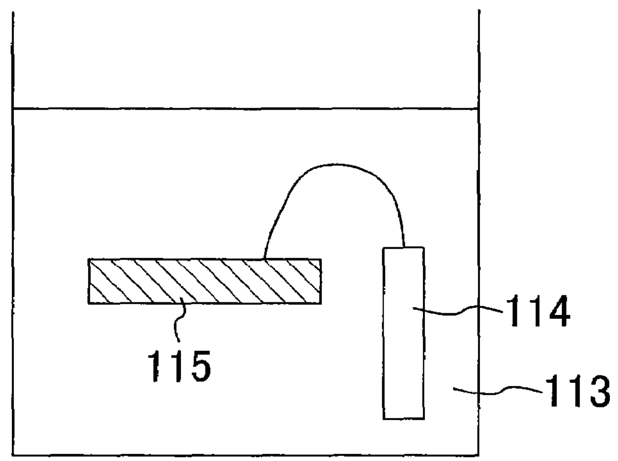
FIG. 9 is a sectional view explaining how to perform a conventional PEC etching.
Figure 10:
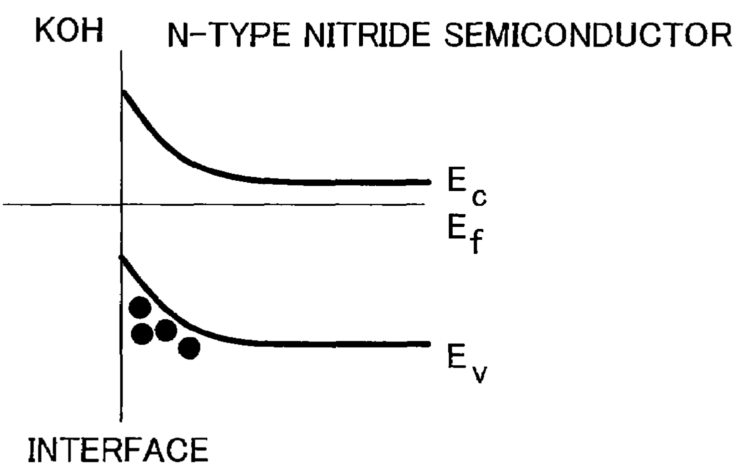
FIG. 10 is a diagram showing the band structure in the case where a conventional n-type nitride semiconductor is brought into contact with a KOH solution.
Figure 11:
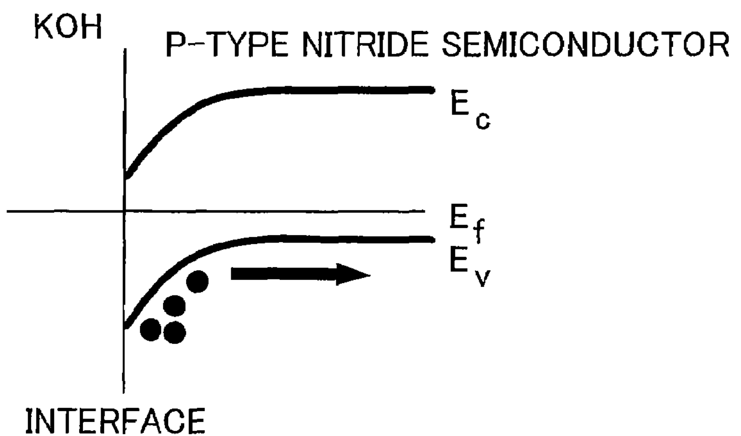
FIG. 11 is a diagram showing the band structure in the case where a conventional p-type nitride semiconductor is brought into contact with a KOH solution.
Figure 12A:
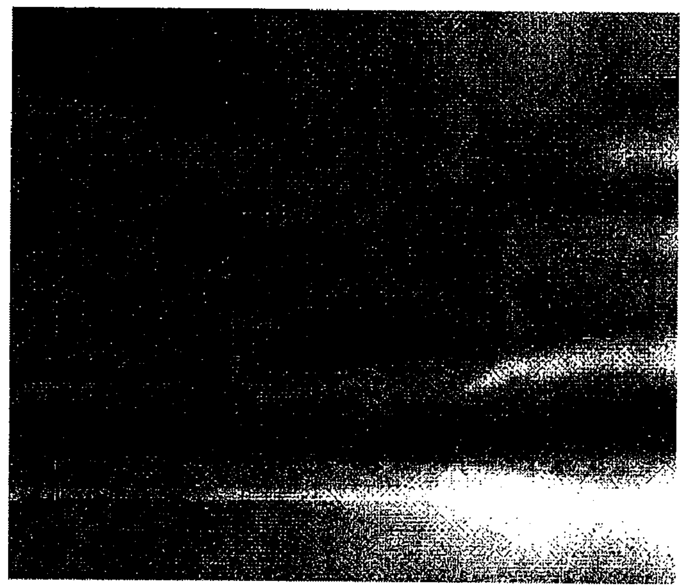
FIG. 12A is a photograph of a cross-sectional TEM image after etching of a conventional current blocking layer.
Figure 12B:
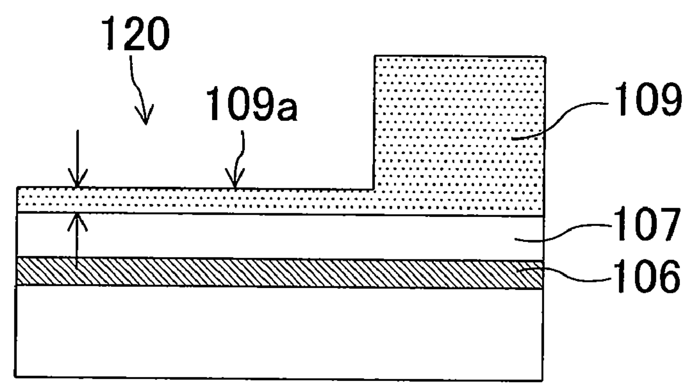
FIG. 12B is a schematic view showing the contours of the image for the sake of easy understanding.
Figure 13:
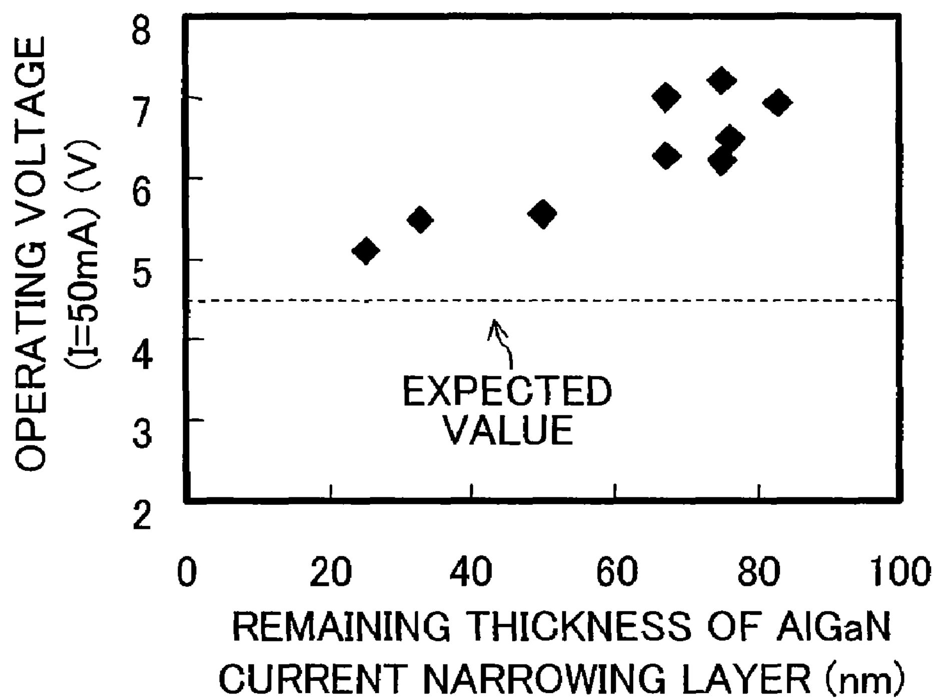
FIG. 13 is a graph showing the relation between the operating voltage and the remaining thickness of the current blocking layer in the conventional nitride semiconductor laser device.
Figure 14:
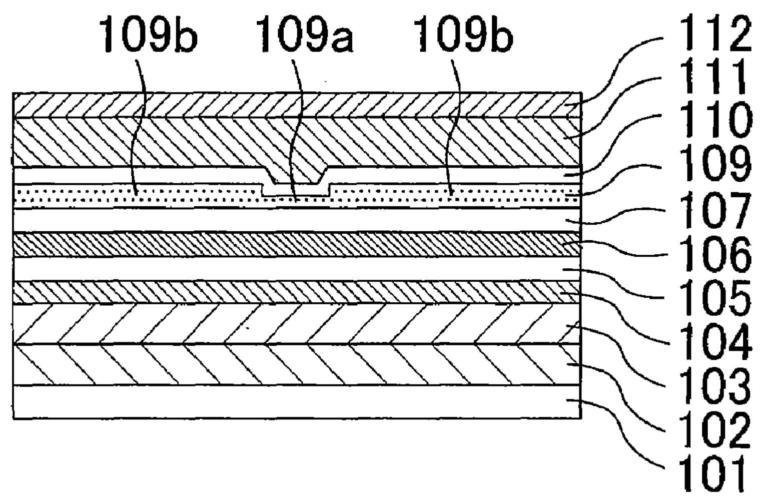
FIG. 14 is a sectional view showing a conventional current blocking structure.
Figure 15:
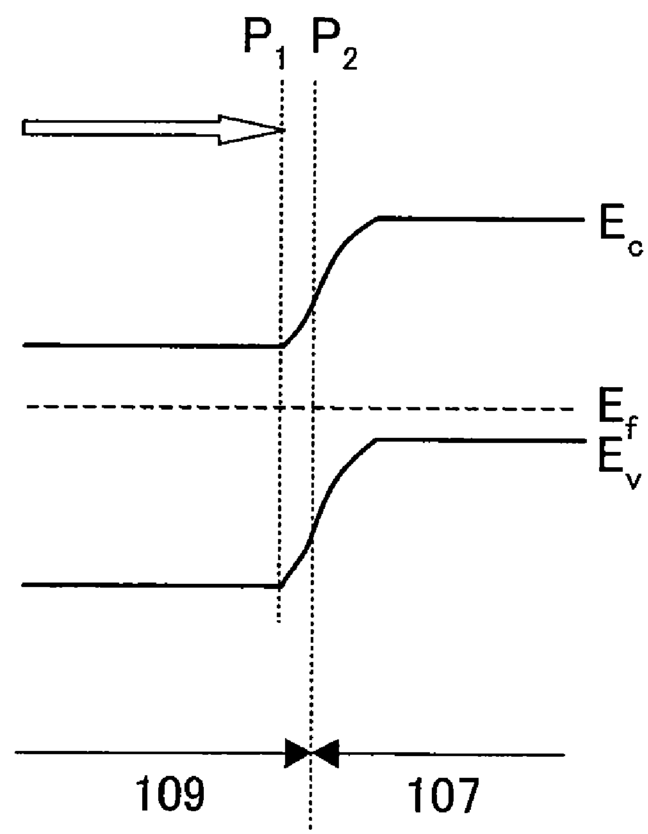
FIG. 15 is a diagram showing the band structure of the conventional current blocking structure.

FIGS. 6A to 6C show band structures in bringing the two layers into junction. FIG. 6A shows the case where the n-AlGaN current blocking layer 9 has a higher Fermi level than the n-GaN layer 8, FIG. 6B shows the case where the n-AlGaN current blocking layer 9 has the same Fermi level as the n-GaN layer 8, and FIG. 6C shows the case where the n-AlGaN current blocking layer 9 has a smaller Fermi level than the n-GaN layer 8. Among them, as shown in FIG. 6A, if the n-AlGaN current blocking layer 9 has a higher Fermi level than the n-GaN layer 8, the band of the n-AlGaN current blocking layer 9 upwardly curves around the interface with the n-GaN layer 8. This upward direction coincides with the direction of the curve of the band at the pn junction shown in FIG. 15, so that it is conceivable that the n-AlGaN current blocking layer 9 is not completely etched and partly remains.

To avoid this problem, by setting the Fermi level of the n-AlGaN current blocking layer 9 to be equal to or lower than the Fermi level of the n-GaN layer 8 as shown in FIGS. 6B and 6C, the band can be curved at the pn junction in the same direction as the direction shown in FIG. 1B. With such a structure, the n-AlGaN current blocking layer 9 can be completely removed to reduce the operating voltage of the blue-violet LD.

Although the present invention has been described in preferred embodiments, the embodiments are not restrictive but can be variously modified. For example, in the above-shown embodiment, the n-GaN layer or the n-InGaN layer is used as the layer 8 formed between the p-GaN guiding layer 7 and the n-AlGaN current blocking layer 9. However, a layer with a smaller band gap than the current blocking layer 9 can exert the same effects. Furthermore, although the p-GaN layer 7 and the p-GaN layer 10 serve as guiding layers, they may serve as cladding layers.

What is claimed is:

1. A method for fabricating a nitride semiconductor laser device including a current blocking layer with an opening for narrowing a current flowing into an active layer, the method comprising:

the step (a) of forming, on the active layer, a p-type first nitride semiconductor layer, an n-type second nitride semiconductor layer, and an n-type third nitride semiconductor layer constituting the current blocking layer in this order;

the step (b) of etching part of the third nitride semiconductor layer by using an alkali solution and irradiating the part with light to form the opening of the current blocking layer; and the step (c) of forming a p-type fourth nitride semiconductor layer on the third nitride semiconductor layer to cover the opening of the current blocking layer, wherein the second nitride semiconductor layer has a smaller energy gap than the third nitride semiconductor layer, a depletion region is formed between the first nitride semiconductor layer and the second nitride semiconductor layer, and the second nitride semiconductor layer has a thickness greater than the width of a portion of the depletion region formed in the second nitride semiconductor layer, and in the step (b), the etching stops at an edge of the depletion region in the n-type second nitride semiconductor layer.

2. The method of claim 1, wherein in the step (c), the conductivity of a region of the second nitride semiconductor layer located below the opening is changed to a p-type conductivity by diffusing a p-type impurity from at least one of the first nitride semiconductor layer and the fourth nitride semiconductor layer.

3. The method of claim 1, wherein the thickness of the second nitride semiconductor layer falls within a range between 5 and 50 nm.

4. The method of claim 1, wherein the first nitride semiconductor layer and the fourth nitride semiconductor layer serve as guiding layers or cladding layers.

5. The method of claim 1, wherein the second nitride semiconductor layer is made of a GaN layer, and the third nitride semiconductor layer is made of an AlGaN layer.

6. The method of claim 5, wherein the GaN layer contains In.

7. The method of claim 6, wherein the In content in the GaN layer is 2% or higher.

8. The method of claim 6, wherein the GaN layer further contains Al.

9. The method of claim 5, wherein the AlGaN layer is formed of a plurality of layered portions, and a layered portion in contact with the second nitride semiconductor layer has a smaller Al content than a layered portion in contact with the fourth nitride semiconductor layer.

10. The method of claim 5, wherein the AlGaN layer contains In.

11. The method of claim 5, wherein the first and fourth nitride semiconductor layers are each made of a GaN layer.

12. The method of claim 1, wherein the Fermi level of the third nitride semiconductor layer is equal to or lower than the Fermi level of the second nitride semiconductor layer.

13. The method of claim 1, further comprising, after the step (b) and before the step (c), the step of introducing a p-type impurity into a region of the second nitride semiconductor layer located below the opening.

* * * * *